(12) United States Patent
Oike

(10) Patent No.: US 8,687,097 B2
(45) Date of Patent: Apr. 1, 2014

(54) SOLID-STATE IMAGE-PICKUP DEVICE, METHOD FOR DRIVING SOLID-STATE IMAGE-PICKUP DEVICE, AND IMAGE-PICKUP APPARATUS

(75) Inventor: Yusuke Oike, Kanagawa (JP)

(73) Assignee: Sony Corporation (JP)

( * ) Notice: Subject to any disclaimer, the term of this patent is extended or adjusted under 35 U.S.C. 154(b) by 134 days.

(21) Appl. No.: 13/325,172

(22) Filed: Dec. 14, 2011

(65) Prior Publication Data

US 2012/0086842 A1  Apr. 12, 2012

(30) Foreign Application Priority Data

Oct. 6, 2006 (JP) .................... 2006-274750

(51) Int. Cl.
  *H04N 3/14* (2006.01)
(52) U.S. Cl.
  USPC .......................... 348/294; 348/308
(58) Field of Classification Search
  USPC .............. 348/294, 308, 302; 257/430–435, 257/290–293, 59, 219, 239, 240, 246
  See application file for complete search history.

(56) References Cited

U.S. PATENT DOCUMENTS

| | | | |
|---|---|---|---|
| 6,933,972 B2 * | 8/2005 | Suzuki et al. | 348/302 |
| 7,250,970 B2 | 7/2007 | Shinohara | |
| 7,911,519 B2 | 3/2011 | Saito et al. | |
| 7,939,868 B2 | 5/2011 | Koizumi | |
| 2002/0067303 A1 | 6/2002 | Lee et al. | |
| 2010/0214462 A1 * | 8/2010 | Itakura | 348/302 |

FOREIGN PATENT DOCUMENTS

| | | |
|---|---|---|
| JP | 2003-087664 | 3/2003 |
| JP | 2005-303648 | 10/2005 |
| JP | 2005-311933 | 11/2005 |

\* cited by examiner

*Primary Examiner* — Mohammed Hasan
(74) *Attorney, Agent, or Firm* — Sheridan Ross P.C.

(57) ABSTRACT

A CMOS image sensor in which column-parallel ADCs are mounted. Reference voltages Vref1 to Vref4 having slopes with different gradients and a reference voltage Vref5 are used. Additionally, a comparison circuit that compares an output voltage Vx of a unit pixel with any one of the reference voltages Vref1 to Vref4, and a comparison circuit that compares the one of the reference voltages Vref1 to Vref4 with the reference voltage Vref5 are included in a column processing circuit. High-resolution AD conversion is performed at a high speed by respective operations of the comparison circuits and an up/down counter.

17 Claims, 12 Drawing Sheets

SOLID-STATE IMAGE-PICKUP DEVICE, METHOD FOR DRIVING SOLID-STATE IMAGE-PICKUP DEVICE, AND IMAGE-PICKUP APPARATUS

RELATED APPLICATION DATA

This application is a continuation of U.S. patent application Ser. No. 12/441,056, filed Mar. 12, 2009 now U.S. Pat. No. 8,089,541 B2, the entirety of which is incorporated herein by reference to the extent permitted by law. U.S. patent application Ser. No. 12/441,056 is the Section 371 National Stage of PCT/JP2007/274750. This application claims the benefit of priority to Japanese Patent Application No. 2006-274750, filed Oct. 6, 2006.

BACKGROUND

The present invention relates to a solid-state image-pickup device, a method for driving a solid-state image-pickup device, and an image-pickup apparatus. Particularly, the present invention relates to a solid-state image-pickup device in which an analog-to-digital conversion circuit (hereinafter, abbreviated as ADC (Analog-Digital Converter)) is disposed in each column for a disposition of unit pixels in a matrix form, i.e., in which column-parallel ADCs are mounted, a method for driving the solid-state image-pickup device, and an image-pickup apparatus using the solid-state image-pickup device.

A technology has been reported, in which, in a solid-state image-pickup device, for example, a CMOS image sensor in which column-parallel ADCs are mounted, an up/down counter is used in an ADC that compares an analog signal which is output from a unit pixel with a reference voltage, and that converts the analog signal into a digital signal on the basis of the comparison result, thereby facilitating an operation of canceling an offset value of a reset level that is output when the unit pixel is reset (for example, see Japanese Unexamined Patent Application Publication No. 2005-303648).

FIG. 11 is a block diagram showing a configuration of a CMOS image sensor 100, in which column-parallel ADCs are mounted, according to an example of the prior art.

In FIG. 11, unit pixels 101 have photodiodes and in-pixel amplifiers, and are two-dimensionally disposed in a matrix form, thereby configuring a pixel-array section 102. For an n row-m column disposition of pixels in the pixel-array section 12, each of row control lines 103 (103-1 to 103-n) is disposed in a corresponding one of rows, and each of column signal lines 104 (104-1 to 104-m) is disposed in a corresponding one of columns. Control of row addressing or row scanning for the pixel-array section 102 is performed by a row scanning circuit 105 via the row control lines 103-1 to 103-n.

A column processing circuit 106 is disposed for each of the column signal lines 104-1 to 104-m on a side of one end of the one of the column signal lines 104-1 to 104-m. The column processing circuit 106 is configured by having a comparison circuit 107, an up/down counter 108, a transfer switch 109, and a memory circuit 110.

In the column processing circuit 106, the comparison circuit 107 performs the magnitude comparison between an output signal of a corresponding one of the unit pixels 101 of a selected row, which is obtained via a corresponding one of the column signal lines 104-1 to 104-m, and a reference voltage Vref that is generated by a digital-to-analog conversion circuit (hereinafter, abbreviated as DAC (Digital-Analog Converter)) 111. The DAC 111 generates the reference voltage Vref on the basis of a control signal CS1 and a clock CKS that are supplied from the timing control circuit 112 which operates in synchronization with a master clock MCK.

The operation of the up/down counter 108 is controlled by a control signal CS2 that is supplied from the timing control circuit 112. The up/down counter 108 performs up-counting or down-counting in synchronization with the clock CK, and stops counting in accordance with a change in an output Vco of the comparison circuit 107. The transfer switch 109 is controlled by a control signal CS3 that is supplied from the timing control circuit 112 so that the transfer switch 109 is turned on (open)/turned off (closed), and transfers a counter value of the up/down counter 108 to the memory circuit 110. Counter values that are maintained in the memory circuit 110 are sequentially read by column scanning with a column scanning circuit 113 to a horizontal output line 114, and are obtained as image-pickup data.

Next, an operation of the CMOS image sensor 100, which has the above-described configuration, according to the example of the prior art will be described with reference to a timing chart shown in FIG. 12.

A reset component $\Delta V$ of the unit pixel 101 is read in a first reading operation. The reset component $\Delta V$ includes, as an offset, noise that has a fixed pattern and that varies among the unit pixels 101. However, because the variation of the reset component $\Delta V$ is generally small and the reset level is common for all of the pixels, signal voltages Vx of the column signal lines 104-1 to 104-m are approximately known.

Accordingly, in a case of the first reading of the reset component $\Delta V$, a comparison period in the comparison circuit 107 can be reduced by adjusting the reference voltage Vref. Regarding reading of the reset component $\Delta V$, the up/down counter 108 performs down-counting in synchronization with the clock CK, and continues counting until the output Vco of the comparison circuit 107 changes. A counter value in a case in which the output Vco of the comparison circuit changes and in which counting stops corresponds to $\Delta V$.

Although a signal component Vsig of the unit pixel 101 is read in a second reading, in addition to the signal component Vsig, a variation component $\Delta V$ is included in a read value in this case. In the second reading, the up/down counter 108 performs up-counting in synchronization with the clock CK, and continues counting until the output Vco of the comparison circuit 107 changes.

Because a counter value that is obtained by up-counting corresponds to the sum of the signal component Vsig and the variation component $\Delta V$, a value that is obtained by subtracting a result of the first reading from a result of the second reading corresponds the signal component Vsig. In other words, a value that is obtained by up-counting from an initial counter value which is provided before the first reading is performed corresponds to the signal component Vsig. This corresponds to an operation of correlated double sample (CDS) in which a variation component is cancelled.

In the CMOS image sensor 100 in which column-parallel ADCs are mounted, it is desired that the resolution of AD conversion be high. In contrast, in a unit pixel having a large amount of incident light, random noise caused by shot noise is predominant, and the necessity to perform high-resolution AD conversion is not great. High-resolution AD conversion is particularly required for a case in which the amount of incident light is small, and in which the amplitude of the output of the unit pixel 101 is small.

SUMMARY OF THE INVENTION

In the above-described CMOS image sensor 100, in which column-parallel ADCs are mounted, according to the example of the prior art, when the resolution of the AD conversion is to be increased, the number of clocks that is necessary for a counting operation of the up/down counter 108 increases. For example, when 10-bit AD conversion is to be performed, $2^{10}$ clocks (=1024 clocks) are necessary. Furthermore, when 12-bit AD conversion, which is realized by adding two bits to 10 bits, is to be performed, $2^{12}$ clocks (=4096 clocks) are necessary. In other words, the necessary number of clocks is of the order of the exponent of the resolution, and it was difficult to realize both high-resolution AD conversion and enhancement of the speed of AD conversion.

Hence, the present invention aims to provide a solid-state image-pickup capable of performing high-resolution AD conversion at a high speed, a method for driving the solid-state image-pickup device, and an image-pickup apparatus.

DISCLOSURE OF INVENTION

In order to achieve the above-mentioned aim, the present invention employs a configuration in which, in a solid-state image-pickup device having a pixel-array section in which unit pixels including photoelectric conversion elements are two-dimensionally disposed in a matrix form, and in which each of column signal lines is disposed in a corresponding one of columns for a disposition of the unit pixels in the matrix form, and having row scanning means for selectively controlling the respective unit pixels of the pixel-array section on a row-by-row basis, an operation of AD conversion is performed, the operation of AD conversion including, comparing, with any one of a plurality of first reference voltages having slopes with the same gradient, an analog signal that is output from a corresponding one of the unit pixels of a row which is selectively controlled by the row scanning means via a corresponding one of the column signal lines; comparing, with the one of the plurality of first reference voltages, a second reference voltage having a slope with a gradient that is different from the gradient of the slopes of the first reference voltages; performing a counting operation using a counting amount according to comparison results; and providing, as a digital signal, a counter value that is obtained by the counting operation.

In the solid-state image-pickup device having the above-described configuration, n first reference voltages are used as reference voltages having slopes, and level determination is performed using a reference voltage that is selected from among the first reference voltages so that the reference voltage is suitable for the signal level of the analog signal, whereby a time necessary for AD conversion can be reduced so that it is 1/n of a time in a case in which a single reference voltage is used. Particularly, in addition to the n first reference voltages, a second reference voltage having a slope with a gradient that is different from the gradient of the slopes of the first reference voltages is used. Additionally, first and second comparison means are included, and the operation of AD conversion is performed by respective operations of the comparison means and counting means, whereby high-resolution AD conversion can be performed at a high speed without depending on the accuracies of offsets of the n first reference voltages.

According to the present invention, a time necessary for AD conversion can be reduced, and high-resolution AD conversion can be performed at a high speed without depending on the accuracies of offsets of the n first reference voltages. Since high-resolution AD conversion can be performed at a high speed, an image with a high quality can be obtained at a high frame rate.

DETAILED DESCRIPTION OF PRESENTLY PREFERRED EMBODIMENTS

Embodiments of the present invention will be described below in detail with reference to the drawings.

First Embodiment

Figure 1:
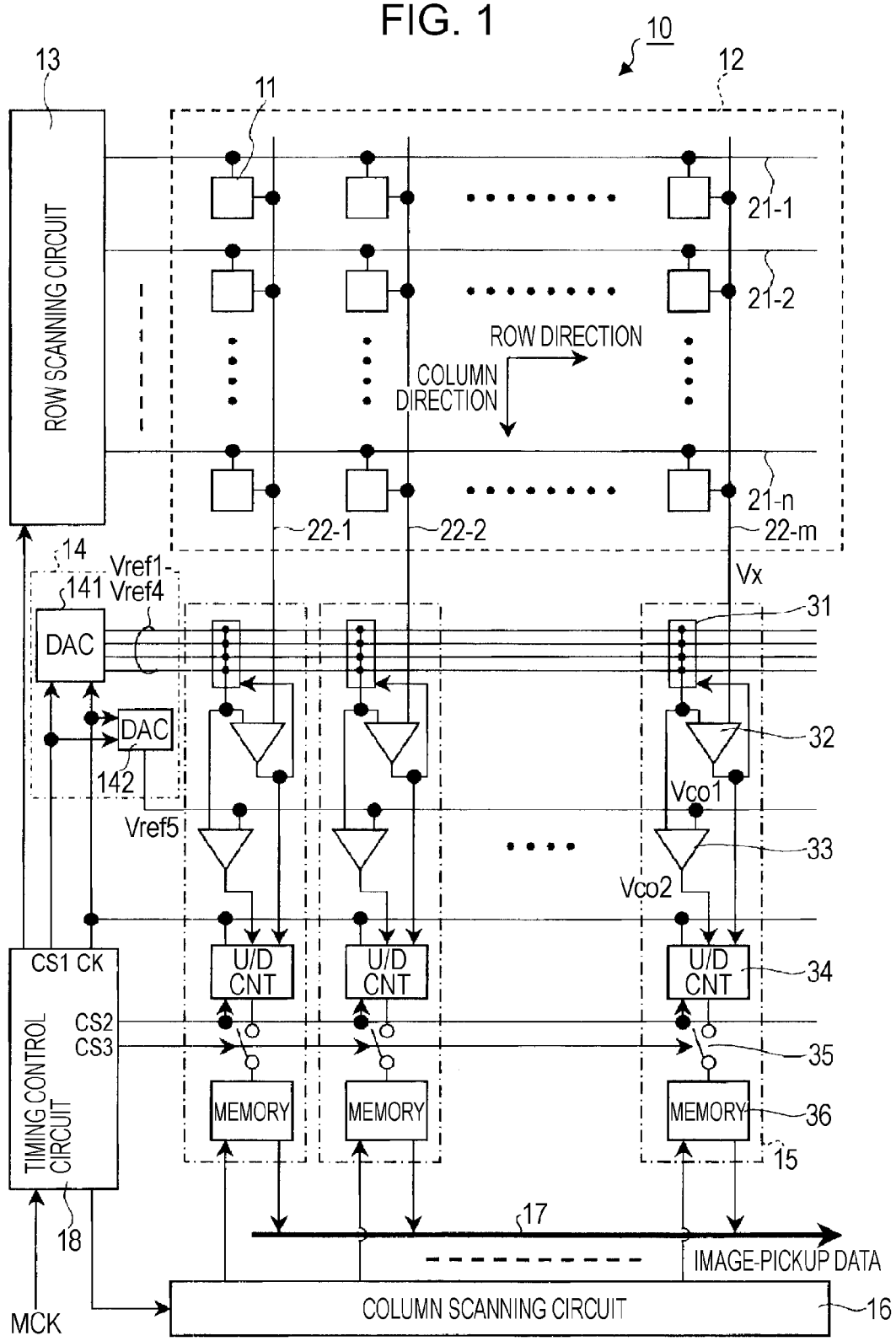
FIG. 1 is a block diagram showing a configuration of a CMOS image sensor, in which column-parallel ADCs are mounted, according to a first embodiment of the present invention.

FIG. 1 is a block diagram showing a configuration of a solid-state image-pickup device according to a first embodiment of the present invention, for example, a CMOS image sensor in which column-parallel ADCs are mounted.

As shown in FIG. 1, a CMOS image sensor 10 according to this embodiment is configured by having a pixel-array section 12 in which a large number of unit pixels 11 including photoelectric conversion elements are two-dimensionally disposed in a matrix form, and by also having a row scanning circuit 13, a reference-voltage generating circuit 14, column processing circuits 15, a column scanning circuit 16, a horizontal output line 17, and a timing control circuit 18 as drive systems and signal processing systems in the vicinity of the pixel-array section 12.

In this system configuration, the timing control circuit 18 generates a clock signal CK, control signals CS1 to CS3, and so forth, which serve as references of operations of the row scanning circuit 13, the reference-voltage generating circuit 14, the column processing circuits 15, the column scanning circuit 16, and so forth, on the basis of a master clock MCK, and supplies the clock signal CK, control signals CS1 to CS3, and so forth to the row scanning circuit 13, the reference-voltage generating circuit 14, the column processing circuits 15, the column scanning circuit 16, and so forth.

As each of the unit pixels 11, here, although an illustration is omitted, a unit pixel having, in addition to a photoelectric conversion element (for example, a photodiode), for example, a three-transistor configuration, which has a transfer transistor that transfers charge which is obtained by photoelectric conversion using the photoelectric conversion element to an FD (floating diffusion) unit; a reset transistor that controls the potential of the FD unit; and an amplifier transistor that outputs a signal in accordance with the potential of the FD unit, a pixel having a four-transistor configuration, which, in addition, separately has a selection transistor for performing pixel selection, or the like can be used.

In the pixel-array section 12, for an n row-m column disposition of the unit pixels 11, each of row control lines 21 (21-1 to 21-*n*) is disposed in a corresponding one of pixel rows, and each of column signal lines 22 (22-1 to 22-*m*) is disposed in a corresponding one of pixel columns. One end of each of the row control lines 21-1 to 21-*n* is connected to a corresponding one of output terminals, which correspond to the respective rows, of the row scanning circuit 13. The row scanning circuit 13 is configured using a shift register or an address decoder, and so forth, and performs control of row addressing or row scanning for the pixel-array section 12 via the row control lines 21-1 to 21-*n*.

The reference-voltage generating circuit 14 uses, for example, DACs (digital-to-analog conversion circuits) as means for generating reference voltages Vrefs whose waveforms have slopes (gradients) in which levels change stepwise as time elapses. The reference-voltage generating circuit 14 is configured by having DACs 141 and 142 that generate plural types of, for example, two types of, reference voltages Vrefs having slopes with different gradients on the basis of the clock CK that is provided from the timing control circuit 18 under control by the control signal CS1 which is provided from the timing control circuit 18. Note that the means for generating reference voltages Vref1 to Vref5 whose waveforms have slopes is not limited to the DACs.

The DAC 141 generates a plurality of reference voltages having slopes with the same gradient and having different offsets, for example, downward slopes, for example, the four reference voltages Vref1 to Vref4. In contrast, the DAC 142 generates the reference voltage Vref5 having a slope with a gradient that is different of the gradient of the slopes of the reference voltages Vref1 to Vref4, specifically, having a slope of a gradient that is higher than the gradient of the slopes of the reference voltages Vref1 to Vref4, for example, having an upward slope, under control by the control signal CS1 that is provided from the timing control circuit 18.

Each of the column processing circuits 15 is provided, for example, in a corresponding one of the pixel columns of the pixel-array section 12, i.e., for a corresponding one of the column signal lines 22-1 to 22-*m*. The column processing circuit 15 has a function of serving as AD conversion (analog-to-digital conversion) means for converting an output voltage (analog signal) Vx, which is output for a corresponding one of the columns from a corresponding one of the unit pixels 11 of the pixel-array section 12, into a digital signal. All of the respective column processing circuits 15, which are provided in a corresponding one of the pixel columns of the pixel-array section 12, have the same configuration.

Note that the column processing circuit 15 is configured to be able to selectively perform operations of AD conversion corresponding respective operation modes including a normal frame rate mode using a progressive scanning scheme in which information concerning all of the unit pixels 11 is read, and a high-speed frame rate mode in which an exposure time for the unit pixels 11 is set to be 1/N and the frame rate is increased N times, for example, twice, compared with the case of the normal frame rate mode.

Mode switching between the normal frame rate mode and the high-speed frame rate mode is performed under control by the control signals CS2 and CS3 that are provided from the timing control circuit 18. Additionally, instruction information for switching between the respective operation modes including the normal frame rate mode and the high-speed frame rate mode is provided from an external system controller (not illustrated) to the timing control circuit 18.

(Column Processing Circuit)

Here, the details of the configuration of the column processing circuit 15 will be specifically described.

The column processing circuit 15 is configured by having a reference-voltage selection circuit 31, comparison circuits 32 and 33, an up/down counter (in the figure, U/DCNT) 34 serving counting means, a transfer switch 35, and a memory circuit 36.

The reference-voltage selection circuit 31 takes, as inputs, for example, the four reference voltages Vref1 to Vref4 that are generated by the DAC 141. The reference-voltage selection circuit 31 selects any one of the four reference voltages Vref1 to Vref4 on the basis of a comparison output Vco1 of the comparison circuit 32, and supplies it as a comparison reference voltage of the comparison circuit 32 to the comparison circuit 32.

The comparison circuit 32 compares the output voltage Vx, which is provided from each of the unit pixels 11 of the pixel-array section 12 via a corresponding one of the column signal lines 22-1 to 22-*m*, with any one of the reference voltages Vref1 to Vref4, which is selected by the reference-voltage selection circuit 31. For example, when the one of the reference voltages Vref1 to Vref4 whose waveforms have downward slopes becomes higher than the output voltage Vx, the comparison output Vco1 is set to be in an active ("H" level) state. When the one of the reference voltages Vref1 to Vref4 becomes equal to or lower than the output voltage Vx, the comparison output Vco1 is set to be in an inactive ("L" level) state.

The comparison circuit 33 compares the one of the reference voltages Vref1 to Vref4, which is selected by the reference-voltage selection circuit 31, with the reference voltage Vref5 that is generated by the DAC 142. For example, when the reference voltages Vref1 to Vref4 whose waveforms have downward slopes become higher than the reference voltage Vref5 whose waveform having an upward slope, a comparison output Vco2 is set to be in an active state. When the reference voltages Vref1 to Vref4 become equal to or lower than the reference voltage Vref5, the comparison output Vco2 is set to be in an inactive state.

The clock CK is provided from the timing control circuit 18, at the same time at which the clock CK is provided to the DACs 141 and 142, to the up/down counter 34 under control by the control signal CS2 that is provided from the timing control circuit 18. The up/down counter 34 performs down (DOWN)-counting or up(UP)-counting in synchronization with the clock CK, and switches a counting amount in accordance with the logics ("H" level/"L" level) of the respective comparison outputs Vco1 and Vco2 of the comparison circuits 32 and 33. The counting amount is determined in accordance with a ratio of the gradient of the slopes of the reference voltages Vref1 to Vref4 to the gradient of the slope of the reference voltage Vref5.

As described above, the present invention is characterized in that the column processing circuit 15 has the plurality of comparison circuits, the two comparison circuits 32 and 33 in this example, and in that plural types of reference voltages having slopes with different gradients, for example, the reference voltages Vref1 to Vref4 and the reference voltage Vref5, are simultaneously used. AD conversion, in which the output voltage (analog signal) Vx of each of the unit pixels 11 of the pixel-array section 12 is converted into a digital signal, is performed by respective operations of the comparison circuits 32 and 33 and the up/down counter 34.

(Principle of AD Conversion)

Here, the principle of AD conversion according to this embodiment will be described with reference to FIG. 2. Note that, in FIG. 2, any one of the reference voltages Vref1 to Vref4, which is selected by the reference-voltage selection circuit 31, is shown as a reference voltage Vrefa, and the reference voltage Vref5 that is generated by the DAC 142 is shown as a reference voltage Vrefb.

As previously described, the reference voltage Vrefa and the reference voltage Vrefb are shown as signals having slopes with different gradients. Here, it is supposed that the gradient of the reference voltage Vrefb is n in a case in which the gradient of the reference voltage Vrefa is −1. The reference voltage Vrefa changes at a gradient of −1 from an offset voltage Voa. The magnitude determination between the reference voltage Vrefa and the output voltage Vx of the unit pixel 11 is performed by the comparison circuit 32. The comparison output (comparison result) Vco1 is obtained by the determination. In contrast, the reference voltage Vrefb changes at a gradient of n from an offset voltage Vob. The magnitude determination between the reference voltage Vrefb and the other reference voltage Vrefa is performed by the comparison circuit 33. The comparison output Vco2 is obtained by the determination.

Figure 2:
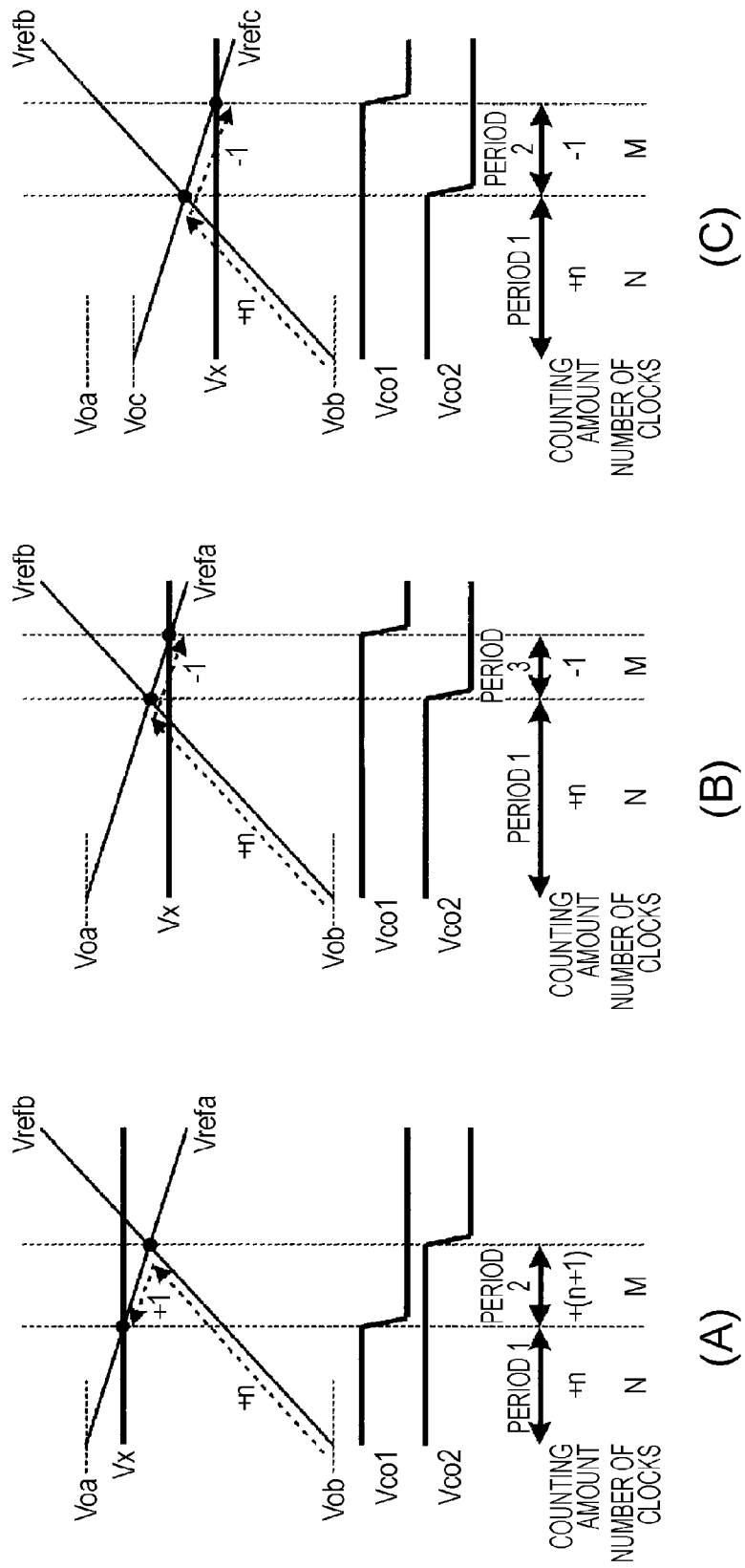
FIG. 2 includes diagrams (part 1) explaining a principle of AD conversion.

In an example of part (A) of FIG. 2, a case is shown, in which, first, a transition of the comparison output Vco1 of the comparison circuit 32 from an "H" level to an "L" level occurs, and in which, then, a transition of the comparison output Vco2 of the comparison circuit 33 from an "H" level to an "L" level occurs. In order to obtain the level of the output voltage Vx relative to the offset voltage Vob, the level is obtained by performing counting with a counting amount of +n along the gradient of the reference voltage Vrefb in a period 1 and a period 2, and with a counting amount of +1 along the gradient of the reference voltage Vrefa in the period 2 only times corresponding to the number of clocks in the periods. Here, in a case in which the number of clocks in the period 1 is N, and in which the number of clocks in the period 2 is M, Vx−Vob which is the level of the output voltage Vx relative to the offset voltage Vob corresponds to nN+(n+1)M.

In an example of part (B) of FIG. 2, first, a transition of the comparison output Vco2 of the comparison circuit 33 from the "H" level to the "L" level occurs, and, then, a transition of the comparison output Vco1 of the comparison circuit 32 from the "H" level to the "L" level occurs. In order to obtain the level of the output voltage Vx relative to the offset voltage Vob, the level is obtained by performing counting with a counting amount of +n along the gradient of the reference voltage Vrefb in the period 1, and a counting amount of −1 along the gradient of the reference voltage Vrefa in a period 3 only times corresponding to the number of clocks in the periods.

In other words, the reference voltage Vrefb crosses the output voltage Vx before the reference voltage Vrefa crosses the output voltage Vx, and this means that counting is performed too many times. For this reason, counting is performed with a counting amount of −1. Here, in a case in which the number of clocks in the period 1 is N, and in which the number of clocks in the period 3 is M, Vx−Vob which is the level of the output voltage Vx relative to the offset voltage Vob corresponds to nN−M.

Switching between the counting amounts (+n/+(n+1)/−1) of the up/down counter 34 is performed on the basis of the logic ("H" level/"L" level) states of the comparison output Vco1 of the comparison circuit 32 and the comparison output Vco2 of the comparison circuit 33.

Specifically, in a case in which both of the respective comparison outputs Vco1 and Vco2 of the comparison circuits 32 and 33 have the "H" levels, the case is regarded as the period 1, and the counting amount is set to +n. In a case in which only the comparison output Vco2 of the comparison circuit 33 has the "H" level, the case is regarded as the period 2, and the counting amount is set to +(n+1). In a case in which only the comparison output Vco1 of the comparison circuit 32 has the "H" level, the case is regarded as the period 3, and the counting amount is set to −1. In a case in which both of the respective comparison outputs Vco1 and Vco2 of the comparison circuits 32 and 33 have the "L" levels, the counting amount is set to zero.

An operation of AD conversion will be specifically described below. First, a case in which the same pair of reference voltages is used when a variation component ΔV is obtained in a first reading and when the sum of a signal component Vsig and the variation component ΔV is obtained in a second reading, i.e., a case in which the reference voltage Vrefa and the reference voltage Vrefb shown in FIG. 2 are used in both the first reading and the second reading, is considered.

When subtraction of the variation component ΔV, which is a result of the first reading, from a result of the second reading, i.e., so-called correlated double sampling (CDS), is performed, components that influence a result of AD conversion as variations, such as the offset voltage Voa and the offset voltage Vob of the reference voltages, and delay times of the comparison circuits 32 and 33, are simultaneously cancelled.

In this case, a high resolution corresponding to the resolution of AD conversion using a slope with a low gradient, whose speed is low but whose resolution is high, in the prior art, can be obtained in a short conversion time corresponding to the conversion time of AD conversion using a slope with a high gradient, whose speed is high but whose resolution is low in the prior art.

Next, a case in which an offset is added to the reference voltage with a low gradient when the variation component ΔV is obtained in the first reading and when the sum of the signal component Vsig and the variation component ΔV is obtained in the second reading is considered. In other words, as shown in part (c) of FIG. 2, a case in which a reference voltage Vrefc that is obtained by adding an offset to the reference voltage Vrefa is used is considered.

The operation of the up/down counter 34 finishes in a place in which a slope voltage range of the reference voltage Vrefb with a high gradient satisfies an output range of the output voltage Vx of the unit pixel 11. Thus, when the amount of incident light is large and the amplitude of the output of the unit pixel is large, no transition of the comparison result Vco1 between the reference voltage Vrefa with a low gradient and the output voltage Vx occurs. In such a case of the output voltage Vx, the reference voltage is switched to the reference voltage Vrefc having an offset voltage Vco and having a slope with a gradient which is the same as the gradient of the slope of the reference voltage Vrefa as shown in part (c) of FIG. 2, which is obtained by adding an offset to the reference voltage Vrefa. Determination of the counting amount or the like is performed as in the above-described case.

In this case, although an offset value of the reference voltage Vrefc having a slope with a low gradient is not removed by correlated double sampling (CDS), the offset value is detected in each pixel column by using the reference voltage Vrefb having a slope with a high gradient. Although the resolution in this case corresponds to the resolution of AD conversion using the reference voltage Vrefb with a high gradient in the prior art, because switching between the reference voltages can be performed using control that is the same as control which is performed for the above-described high-resolution AD conversion, this case is suitable for a column-parallel process.

In sum, high-speed high-resolution AD conversion is applied to a case of a small output-signal amplitude, in which a high resolution is particularly required, i.e., to a pixel having a small amount of incident light. In contrast, lower-resolution AD conversion is applied to a pixel having a large amount of incident light because, generally, a random noise component caused by shot noise is predominant and a relatively low resolution leads to a sufficient result. Furthermore, switching of the counting amount or control for the up/down counter 34 can be performed in column parallel.

In the above description of the principle, a case in which the reference voltage Vrefa has a downward slope (with a negative gradient), and in which the reference voltage Vrefb has an upward slope (with a positive gradient) is described as an example. However, the signs of the gradients of the slopes may be opposite to each other. In other words, the reference voltage Vrefa may have an upward slope, and the reference voltage Vrefb may have a downward slope. Additionally, the signs of the gradients of the slopes may be the same.

Here, a principle of AD conversion in a case in which both of the gradients of the slopes of the reference voltages Vrefa and Vrefb are negative will be described with reference to FIG. 3.

Here, it is supposed that the gradient of the reference voltage Vrefb is −n in a case in which the gradient of the reference voltage Vrefa is −1. The reference voltage Vrefa changes at a gradient of −1 from the offset voltage Voa. The magnitude determination between the reference voltage Vrefa and the output voltage Vx of the unit pixel 11 is performed by the comparison circuit 32. The comparison output Vco1 is obtained by the determination. In contrast, the reference voltage Vrefb changes at a gradient of −n from the offset voltage Vob. The magnitude determination between the reference voltage Vrefb and the other reference voltage Vrefa is performed by the comparison circuit 33. The comparison output Vco2 is obtained by the determination.

Regarding the counting amount of the up/down counter 34, which is determined by the logic states of the respective comparison outputs Vco1 and Vco2 of the comparison circuits 32 and 33, the gradient of n, which is the gradient of the reference voltage Vrefb, in the operation shown FIG. 2 is simply replaced with a gradient of −n. Thus, as shown in FIG. 3, AD conversion can be realized as in the case of FIG. 2 simply by replacing the gradient of n shown in FIG. 2 with a gradient of −n.

Figure 3:
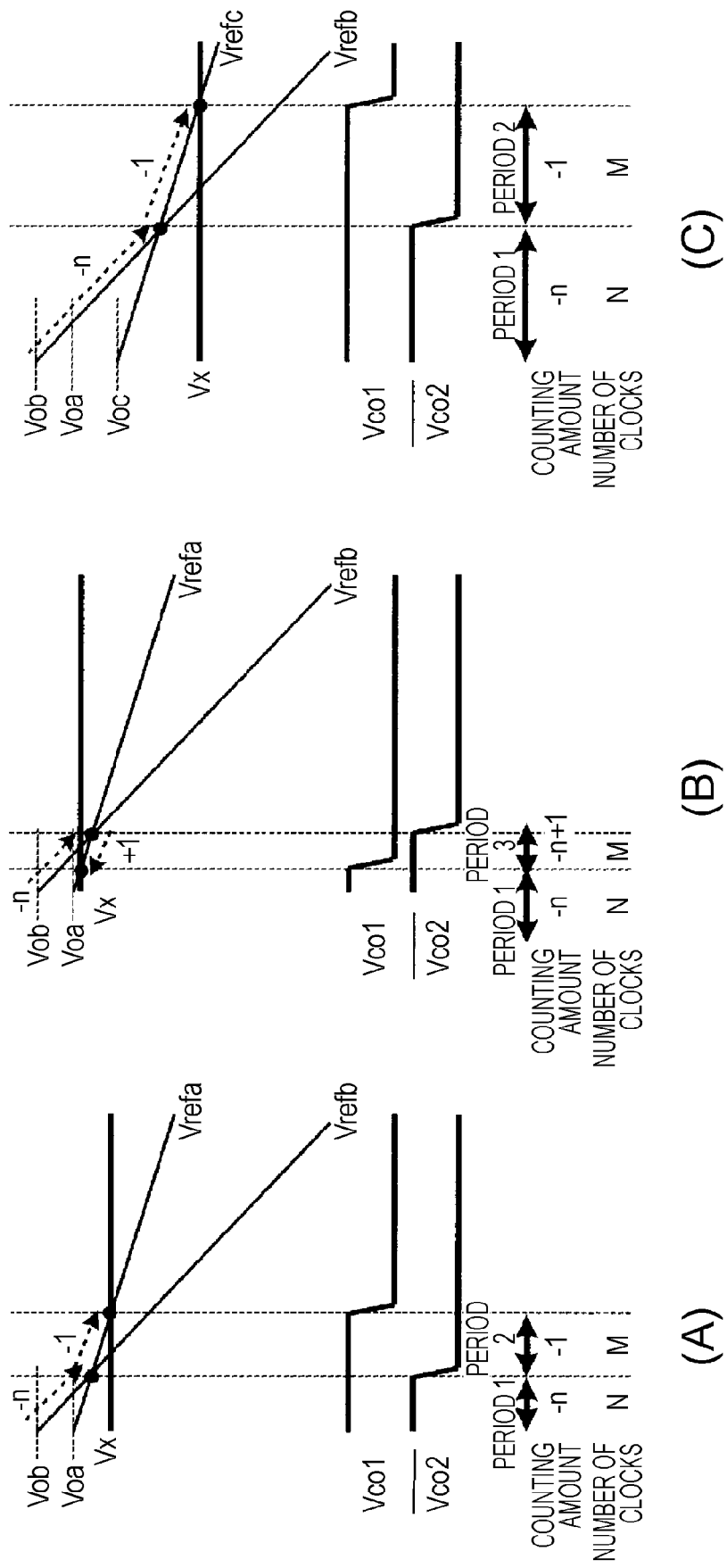
FIG. 3 includes diagrams (part 2) explaining the principle of AD conversion.

However, because it is necessary that the reference voltage Vrefa and the reference voltage Vrefb cross each other, compared with a case in which the signs of the gradients of the reference voltage Vrefa and the reference voltage Vrefb are different from each other, in a case in which the signs of the gradients are the same, it is necessary that the reference voltage Vrefb start to change from a voltage that is higher than the offset voltage Voa of the reference voltage Vrefa, as is clear from FIG. 3. Thus, because a necessary input range of the reference voltage Vrefb is extended, it can be said that a case in which the signs of the gradients are different from each other is preferable.

Furthermore, regarding a voltage resolution of the comparison circuit 33 per clock of the clock CK, the accuracy of the voltage resolution in a case in which the signs of the gradients of the slopes of the reference voltage Vrefa and the reference voltage Vrefb are the same is required to be higher. For example, the gradient of the difference between the reference voltage Vrefa and the reference voltage Vrefb is n−1 (a voltage difference per clock is small) in a case in which the signs of the gradients of the slopes are the same, and is n+1 (the voltage difference per clock is large) in a case in which the signs of the gradients of the slopes are different from each other.

Note that, an example is shown, in which the up/down counter 34 that performs a subtraction process together with a counting operation by performing down-counting and up-counting for the variation component ΔV that is a first analog signal and the signal component Vsig that is a second analog signal, which are sequentially output from the unit pixel 11, is used as counting means in the column processing circuit 15 according to this example. However, the counting means is not limited to the up/down counter 34. A counter that performs a counting operation in synchronization with a synchronization signal (the clock CK) for a comparison time from start of comparison operations of the comparison circuits 32 and 33 to end of the comparison operations may be used.

Return to the description with reference to FIG. 1. The transfer switch 35 is set, in the normal frame rate mode under control by the control signal CS3 that is provided from the timing control circuit 18, to be in an on(open)-state at a point of time at which the counting operation of the up/down counter 34 for the unit pixel 11 of a row finished, and a counting result of the up/down counter 34 is transferred to the memory circuit 36.

In contrast, in the high-speed frame rate mode, the transfer switch 35 is still in an off(closed)-state at a point of time at which the counting operation of the up/down counter 34 for the unit pixel 11 of a row finished. Then, the transfer switch 35 is set to be in the on-state at a point of time at which the counting operation of the up/down counter 34 for the unit pixel 11 of the next row finished, and counting results o the up/down counter 34, which were obtained for, for example, vertical two pixels, are transferred to the memory circuit 36.

In this manner, the output voltage (analog signal) Vx that is supplied for a corresponding one of the columns from a corresponding one of the unit pixels 11 of the pixel-array section 12 via a corresponding one of the column signal lines 22-1 to 22-m is converted into a digital signal by the respective operations of the comparison circuits 32 and 33 and the up/down counter 34 in a corresponding one of the column processing circuits 15, and the digital signal is stored in a corresponding one of the memory circuits 36.

The column scanning circuit 16 is configured using a shift register and an address decoder, and performs control of column addressing and column scanning for the column processing circuits 15. Under control performed by the column scanning circuit 16, digital signals that are obtained by AD conversion in the respective column processing circuits 15 are sequentially read to the horizontal output line 17, and are output as image-pickup data via the horizontal output line 17.

Next, an operation of the CMOS image sensor 10 having the above-described configuration will be described with reference to a timing chart shown in FIG. 4. Herein, it is supposed that the gradient of the slopes of the reference voltages Vref1 to Vref4 is −n, and that the gradient of the slope of the reference voltage Vref5 is n.

Note that, although the description of a specific operation of the unit pixel 11 is omitted, a reset operation and a transfer operation are performed in the unit pixel 11 as has been known. In the reset operation, the potential of the FD unit in a case in which the potential was reset to a predetermined potential is output to a corresponding one of the column signal lines 22-1 to 22-$m$ as the variation component $\Delta V$ of the output of the unit pixel 11. In the transfer operation, the potential of the FD unit in a case in which charge that was obtained by photoelectric conversion was transferred from the photoelectric conversion element is output to the corresponding one of the column signal lines 22-1 to 22-$m$ as the signal component Vsig.

In the first reading, the variation component $\Delta V$ is read. In this case, the reference-voltage selection circuit 31 selects the reference voltage Vref1 from among the reference voltages Vref1 to Vref4. Thus, the comparison circuit 32 compares the output voltage Vx of the unit pixel 11 with the reference voltage Vref1 to obtain the comparison output Vco1. At the same time, the comparison circuit 33 compares the reference voltage Vref1 with the reference voltage Vref5 to obtain the comparison output Vco2.

In this example, first, a transition of the comparison output Vco1 from the "H" level to the "L" level occurs, and, then, a transition of the comparison output Vco2 from the "H" level to the "L" level occurs. Thus, the counting amount is set to n in a period in which both of the comparison outputs Vco1 and Vco2 have the "H" levels. The counting amount is set to n+1 in a period in which only the comparison output Vco2 has the "H" level. Up-counting is performed in synchronization with the clock CK. A counter value at a point of time at which the first reading finished corresponds Vo−$\Delta V$. Here, Vo is an initial voltage of the reference voltage Vref5.

In level determination performed by the comparison circuit 32, the output voltage Vx of the unit pixel 11 is compared with an initial voltage of each of the reference voltages Vref2 to Vref4 in the order of the reference voltage Vref4, the reference voltage Vref3, and the reference voltage Vref2. When an initial voltage first exceeds the output voltage Vx, a reference voltage for which the initial voltage is provided is selected. In this manner, the reference voltage having a slope with a low gradient crosses the output voltage Vx in an AD conversion period. In an example shown in FIG. 4, the reference voltage Vref3 is selected.

Although the counting amount is switched in the second reading as in the case of the first reading, down-counting is performed in the second reading. In other words, in the example shown in FIG. 4, the counting amount is set to n in a period in which both of the comparison outputs Vco1 and Vco2 have the "H" levels. The counting amount is set to n+1 in a period in which only the comparison output Vco2 has the "H" level. Down-counting is performed in synchronization with the clock CK. Because an amount obtained by down-counting corresponds to Vo−(Vsig+$\Delta V$), the final counter value in the AD conversion period corresponds to the signal component Vsig.

Here, a case is considered, in which it is supposed in the prior art that a gradient of a slope of a reference voltage with which a resolution of AD conversion of 12 bits can be obtained is −1, in which it is supposed in this embodiment that the gradient of the reference voltages Vref1 to Vref4, which are reference voltages with a small gradient, is −1, and in which it is supposed that the gradient n of the other reference voltage Vref5 is four. Note that, when a reference voltage with a gradient of four is employed in the prior art, the resolution of AD conversion is 10 bits although the speed of the AD conversion is high.

Under the above-mentioned conditions, the number of clocks that is necessary for 12-bit AD conversion in the prior art is 4096 clocks, and a conversion time that is four times longer than that in a case of 1024 clocks, which is the number of clocks that is necessary for 10-bit AD conversion in the prior art, is necessary.

In contrast, in this embodiment, when the amount of incident light to the unit pixel 11 is small, the same reference voltage that was used in the first reading of the variation component $\Delta V$ is selected also in the second reading of the signal component Vsig, thereby obtaining a resolution of AD conversion of 12 bits. In contrast, when the amount of incident light to the unit pixel 11 is large, an offset is added to a reference voltage with a gradient of one when level determination is performed, and offset correction is performed using the reference voltage Vref5 with a gradient of four, thereby obtaining a resolution of AD conversion of 10 bits.

In other words, in this embodiment, in an AD conversion time of 1024 clocks, 12-bit AD conversion is applied to a signal having a small amplitude that corresponds to a quarter of the maximum amplitude, and 10-bit AD conversion is applied to a signal having a large amplitude. Switching between the 12-bit AD conversion and the 10-bit AD conversion can be performed in column parallel. A time necessary for AD conversion in the second reading corresponds to a time of 10-bit AD conversion of the prior art, and the speed of the AD conversion is high.

Figure 5:
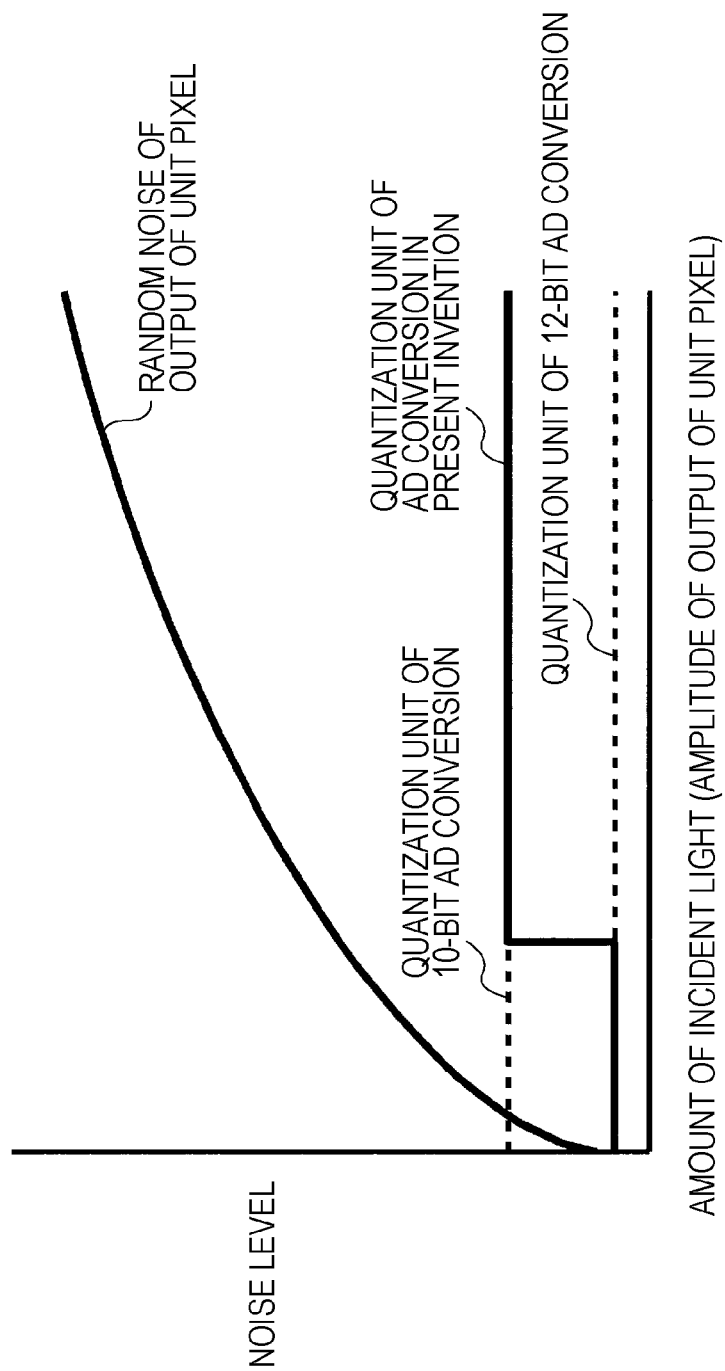
FIG. 5 is a graph showing the relationships between the amount of incident light and noise level.

The random noise component of the output of the unit pixel 11 includes a reading noise component that is equally included every reading, and a shot noise component that is proportional to the square root of the amount of incident light. Relationships shown in FIG. 5 are obtained for the amount of incident light, i.e., the amplitude of the output of the unit pixel 11. In other words, the CMOS image sensor has characteristics that, when the amount of incident light increases, the random noise also increases. Accordingly, even when 10-bit AD conversion is applied to a signal having a large amplitude, there is no practical problem.

In the CMOS image sensor 10 having the above-described configuration, the ratio of the gradients of the plural types of reference voltages having slopes with different gradients (in FIG. 1, the reference voltages Vref1 to Vref4 and the reference voltage Vref5) is arbitrarily set. The ratio can be set in accordance with the resolution of AD conversion in each of a low-illumination region and a high-illumination region.

Additionally, a plurality of voltages with the same gradient and having different offsets are necessary as the reference voltages having slopes with low gradients. When the reference voltages are to be supplied from the outside of the column processing circuit 15 as shown in FIG. 1, a plurality of reference voltages having slopes with the same gradient and having different offsets are to be supplied. The number of reference voltages that are to be supplied can be arbitrarily determined in accordance with the amplitude of the output of the unit pixel 11. However, when the ratio of the absolute values of the gradients of the reference voltages with different gradients (in FIG. 1, the reference voltages Vref1 to Vref4 and the reference voltage Vref5) is 1:n, it is preferable that the reference voltages with low gradients be switched using n or more types of different offsets.

As described above, in the CMOS image sensor 10 in which column-parallel ADCs are mounted, n reference voltages, e.g., the four reference voltages Vref1 to Vref4 in this example, are used as reference voltages having slopes for performing determination of the level of the output voltage Vx of the unit pixel 11 instead of a single reference voltage Vref. Level determination is performed using a reference voltage that is selected from among the reference voltages Vref1 to Vref4 so that the reference voltage is suitable for the level of the output voltage Vx, whereby a time necessary for AD conversion can be reduced so that it is 1/n of a time in a case in which the single reference voltage Vref is used. Thus, the speed of the operation of AD conversion can be enhanced.

Particularly, a configuration is employed, in which, in addition to the four reference voltages Vref1 to Vref4, the reference voltage Vref5, which has a slope with a gradient that is different from the gradient of the slopes of the reference voltages, is used; in which the comparison circuit 32, which compares the output voltage Vx of the unit pixel 11 with any one of the reference voltages Vref1 to Vref4, and the comparison circuit 33, which compares the one of the reference voltages Vref1 to Vref4 with the reference voltage Vref5, are included in the column processing circuits 15; and in which the operation of AD conversion is performed by the respective operations of the comparison circuits 32 and 33 and the up/down counter 34, whereby high-resolution AD conversion can be performed at a high speed without depending on the accuracies of offsets of the reference voltages Vref1 to Vref4, i.e., even in a case in which the differences among the offset voltages of the reference voltages are not equal to one another, as is clear from part (c) of FIG. 2 and part (c) of FIG. 3. Thus, an image with a high quality can be obtained at a high frame rate.

High-resolution AD conversion is applied to the output of a unit pixel having a small amount of incident light, in which the random noise component caused by shot noise is small, and for which high-resolution AD conversion is required. AD conversion with a comparatively low resolution is applied to the output of a unit pixel having a large amount of incident light, in which the random noise component is predominant. The determination for switching between the high-resolution AD conversion and the AD conversion with a comparatively low resolution is performed by the column processing circuit 15 in parallel, and a composition process or the like is unnecessary at the subsequent stage.

A time necessary for AD conversion in the CMOS image sensor 10 according to this embodiment corresponds to a time necessary for AD conversion with a comparatively low in a CMOS image sensor according to an example of the prior art. Thus, the speed of AD conversion in the CMOS image sensor 10 is several times higher than a speed of AD conversion in a case in which a quality that is equal to a quality obtained by performing high-resolution AD conversion which is applied to a unit pixel having a small amount of incident light is obtained using a technique of the prior art. The short period of the operation of AD conversion can contribute reduction in power consumption of the entire CMOS image sensor 10.

Second Embodiment

Figure 6:
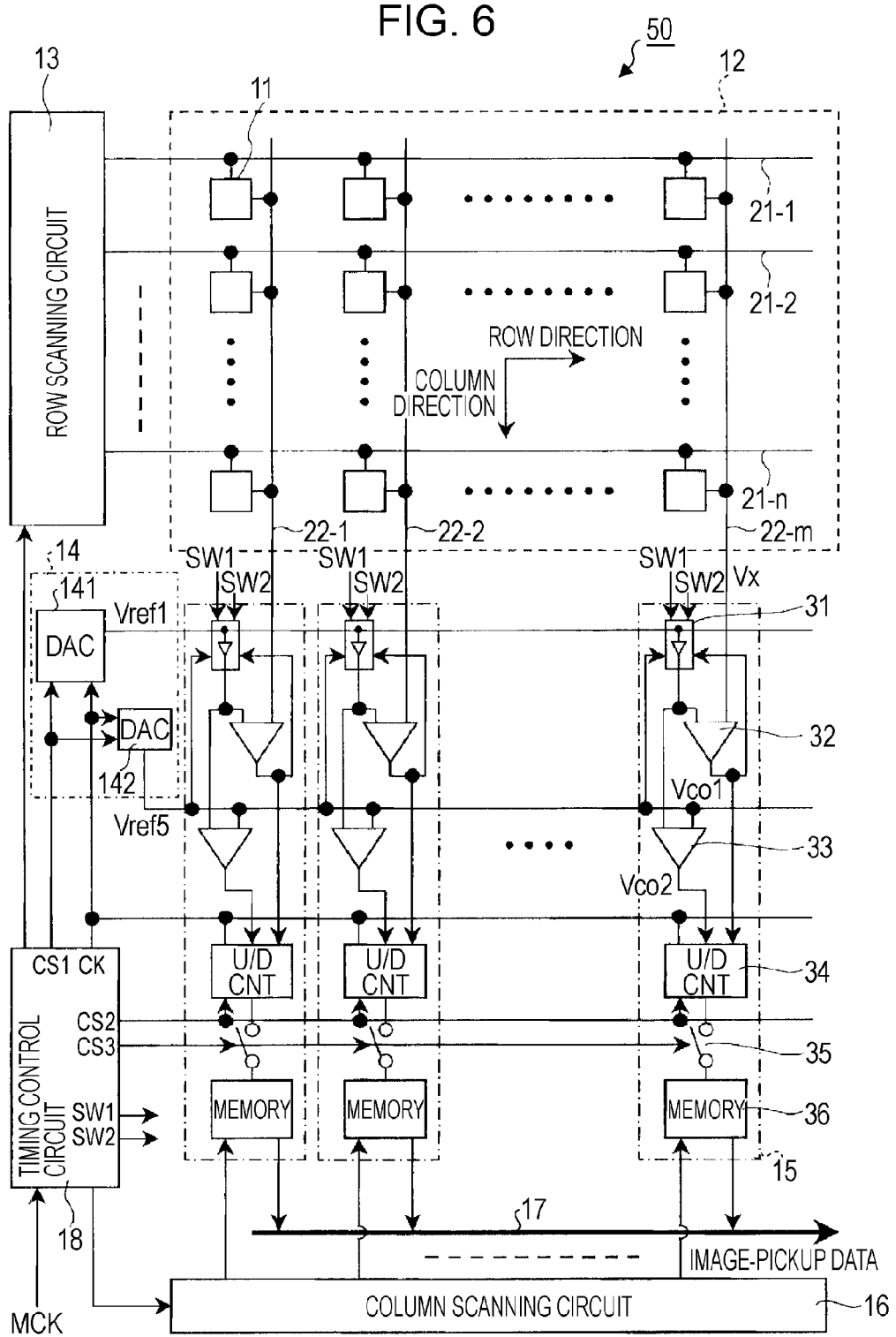
FIG. 6 is a block diagram showing a configuration of a CMOS image sensor, in which column-parallel ADCs are mounted, according to a second embodiment of the present invention.

FIG. 6 is a block diagram showing a configuration of a solid-state image-pickup device according to a second embodiment of the present invention, for example, a CMOS image sensor in which column-parallel ADCs are mounted, and in the figure, portions that are identical to those shown in FIG. 1 are denoted by the same numerals.

In the CMOS image sensor 10 according to the first embodiment, a configuration is employed, in which a plurality of reference voltages having slopes with different gradients and having different offsets are supplied from the outside of the column processing circuit 15. In contrast, in a CMOS image sensor 50 according to this embodiment, a configuration is employed, in which an offset is added in a column processing circuit 15A. The configurations other than the above-mentioned configuration are basically the same as those in the CMOS image sensor 10 according to the first embodiment.

Specifically, as shown in FIG. 6, a configuration is provided, in which, while the single reference voltage Vref1 is generated in the DAC 141, the column processing circuit 15A has, instead of the reference-voltage selection circuit 31, an offset generating circuit 37 that adds an offset to the reference voltage Vref1 for a corresponding one of the columns. The offset generating circuit 37 generates a reference voltage Vref1_off by adding any one of offsets Vo1 to Vo4 to the reference voltage Vref1 that is input from the DAC 141. A specific configuration and operation of the offset generating circuit 37 will be described below.

Figure 7:
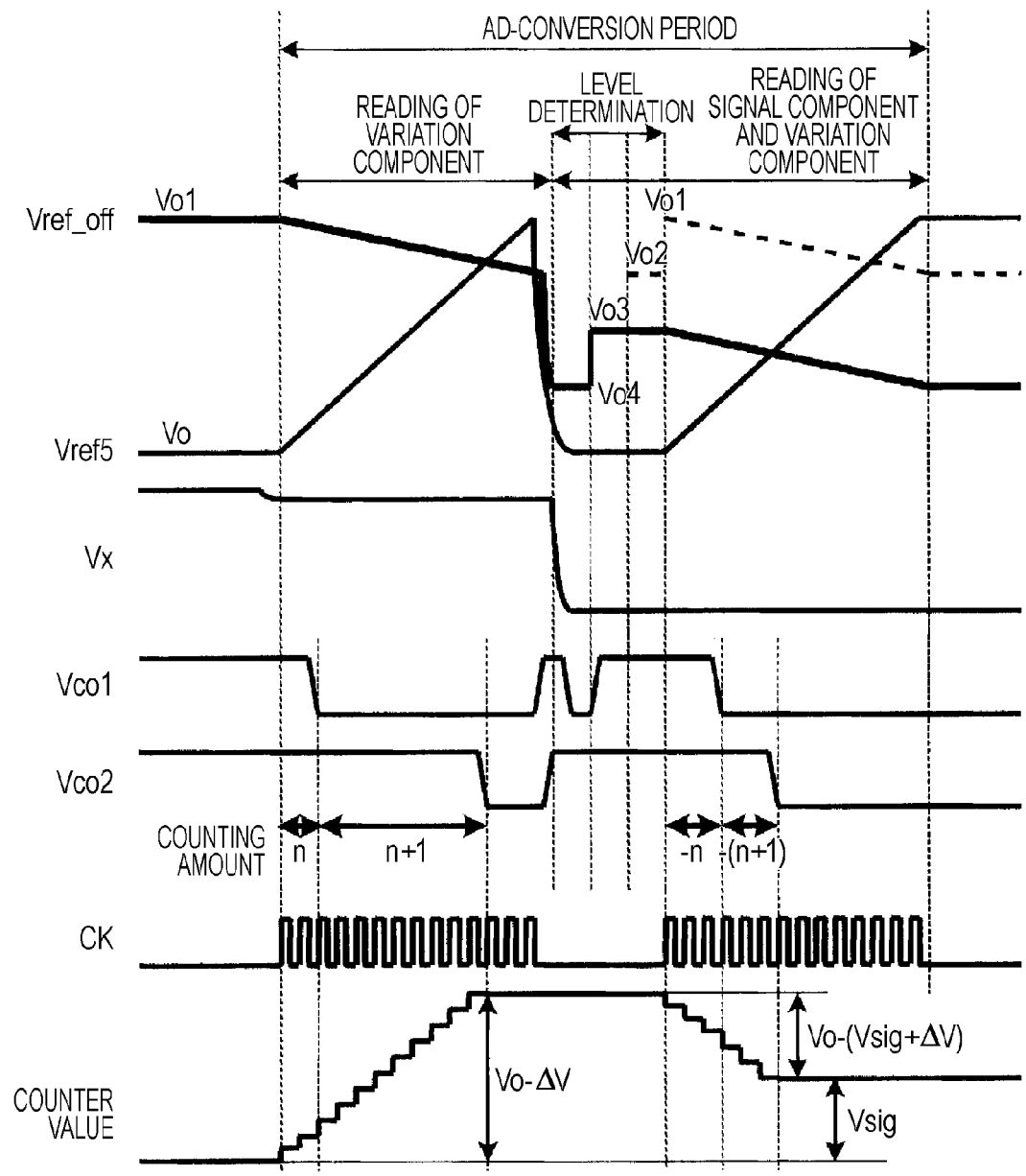
FIG. 7 is a timing chart provided for explaining a circuit operation of the CMOS image sensor according to the second embodiment.

In FIG. 7, a timing chart provided for explaining a circuit operation of the CMOS image sensor 50 according to this embodiment. Operations other than the operation of level determination are the same as those in a case of the CMOS image sensor 10 according to the first embodiment, in which the plurality of reference voltages having slopes with the same gradient and having different offsets are supplied from the outside of the column processing circuit 15.

In the operation of level determination, offset values of the reference voltage Vref1_off are sequentially set in the offset generating circuit 37. One of the offset values in a case in which the reference voltage Vref1_off first exceeds the output voltage Vx of the unit pixel 11, which is determined from a result of the comparison output Vco1 of the comparison circuit 32, is maintained for each column, and AD conversion is performed in the second reading.

In an example shown in FIG. 7, the output voltage Vx is compared with each of the offset values Vo2 to Vo4 in the order of the offset value Vo4, the offset value Vo3, and the offset value Vo2. Here, because the offset value Vo3 exceeds the output voltage Vx, level determination finishes at the point of time, and the process proceeds to an operation of reading the signal component Vsig and the variation component ΔV. When the offset value Vo3 does not exceed the output voltage Vx, the output voltage Vx is compared with the offset value Vo2 as shown using a dotted line in FIG. 7. When even the offset value Vo2 does not exceeds the output voltage Vx, reading is performed using the offset Vo1 that is the same offset used in the first reading.

Figure 4:
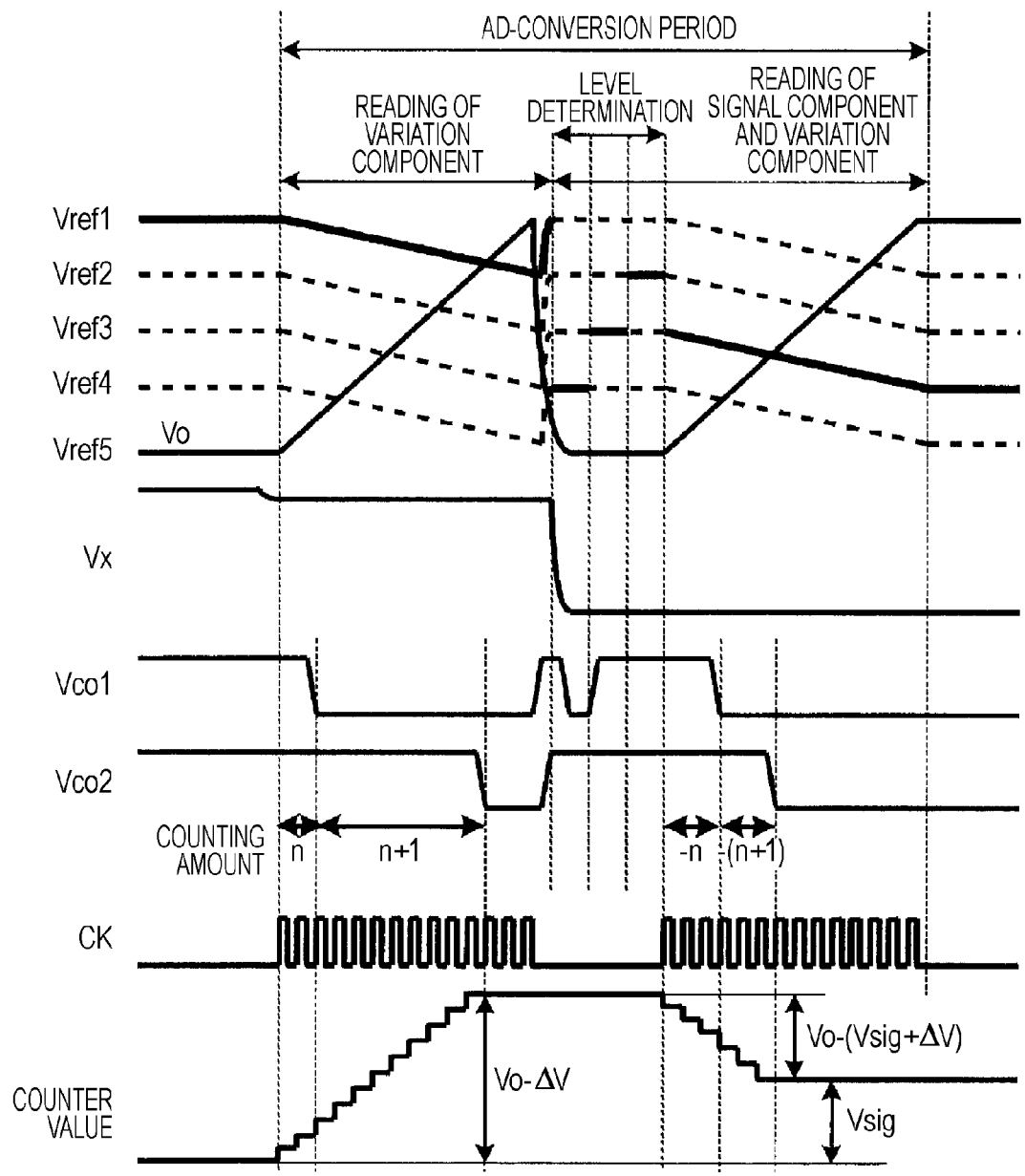
FIG. 4 is a timing chart provided for explaining a circuit operation of the CMOS image sensor according to the first embodiment.

When the signal amplitude of the output voltage Vx is small, because the same offset used in reading of the variation component ΔV is used, high-resolution AD conversion is realized as in the case of the operation shown in FIG. 4, which is performed using the configuration shown in FIG. 1.

(Offset Generating Circuit)

Figure 8:
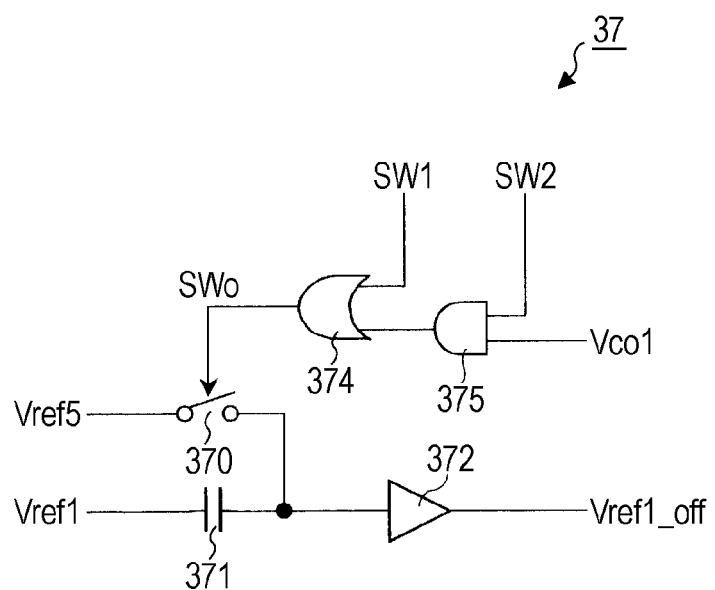
FIG. 8 is a block diagram showing one example of a configuration of an offset generating circuit.

FIG. 8 is a block diagram showing one example of a configuration of the offset generating circuit 37. As shown in FIG. 7, the offset generating circuit 37 according to this example is configured using a capacitor 371, a buffer 372, a switching element 373, an OR gate 374, and an AND gate 357.

The reference voltage Vref1 is input to one end of the capacitor 371, and the reference voltage Vref5 is input to one end of the switching element 373. The respective other ends of the capacitor 371 and the switching element 373 are commonly connected to an input terminal of the buffer 372 so that they configures a sample-and-hold circuit.

Two control signals SW1 and SW2 that are generated by the timing control circuit 18 shown in FIG. 6 are provided to the offset generating circuit 37. The control signal SW1 is a signal for initializing the offset generating circuit 37. The control signal SW2 is a signal for making level determination that is performed by the comparison circuit 32 effective.

The control signal SW1 is taken as one input of the OR gate 374, and the control signal SW2 is taken as one input of the AND gate 375. The AND gate 375 takes the comparison output Vco1 of the comparison circuit 32 as the other input. The OR gate 374 takes the output of the AND gate 375 as the other input. The output of the OR gate 374 is provided as a control signal SWo of the switching element 373.

Then, a circuit operation of the offset generating circuit 37 having the above-described configuration will be described with reference to a timing chart shown in FIG. 9.

As in the case of the CMOS image sensor 10 according to the first embodiment, after a reset level (variation component) $\Delta V$ is obtained, a signal level (signal component) Vsig is output to a corresponding one of the column signal lines 22-1 to 22-$m$. The operation of level determination is performed in the comparison circuit 32. In a period of level determination, the level of the control signal SW is set to "H". Thus, the comparison output Vco1 of the comparison circuit 32 passes the AND gate 375, and is supplied as the control signal SWo of the switching element 373 to the switching element 373 via the OR gate 374.

Next, in a case in which the reference voltage Vref5 exceeds the output voltage Vx of the unit pixel 11, a transition of the output voltage Vco1 of the comparison circuit 32 from the "L" level to the "H" level occurs. The reference voltage Vref5 in this case is held. Regarding the output voltage (reference voltage) Vref1_off of the buffer 372, the voltage changes along the slope of the reference voltage Vref1 from a state in which an added offset corresponding to the held voltage is added to the voltage.

Figure 9:
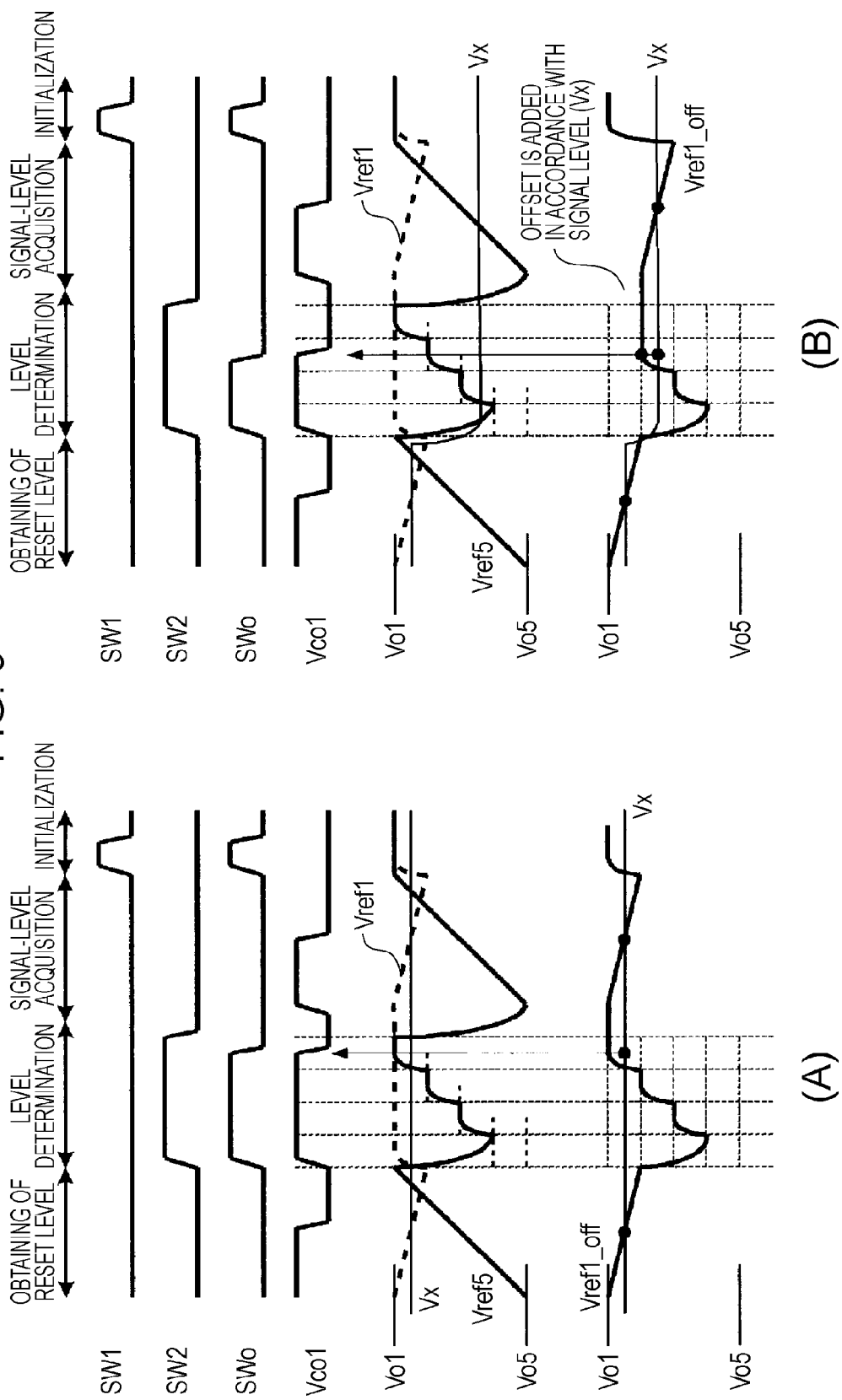
FIG. 9 includes timing charts provided for explaining a circuit operation of the offset generating circuit.

In part (A) of FIG. 9, because the output voltage Vx is a high voltage, no offset is added to a slope, and an operation using the slope is the same as an operation using a slope that is performed to obtain the reset level. In contrast, in part (B) of FIG. 9, because the output voltage Vx is a low voltage, the reference voltage Vref1_off to which an offset that was determined at a time at which a voltage was held in level determination is added is obtained.

Finally, the offset generating circuit 37 is initialized by setting the level of the control signal SW1 to "H", and the next operation of obtaining the reset level starts.

As is clear from the above description, the CMOS image sensor 50 according to this embodiment is different from the CMOS image sensor 10 according to the first embodiment in that an offset is added to the reference voltage Vref1 by the offset generating circuit 37 in the column processing circuit 15A. However, the basic operation of AD conversion is the same as that of AD conversion in the CMOS image sensor 10 according to the first embodiment. Accordingly, also in the CMOS image sensor 50 according to this embodiment, an effect of a function that is similar to an effect of a function that is obtained in the CMOS image sensor 10 according to the first embodiment can be obtained. In other words, high-resolution AD conversion can be performed at a high speed, so that an image with a high quality can be obtained at a high frame rate.

Note that, in the above-described first and second embodiments, each of the column processing circuits 15 or 15A is disposed for a corresponding one of the pixel columns of the pixel-array section 12. However, a system configuration can be employed, in which each of the column processing circuits 15 or 15A is disposed for a corresponding plurality of pixel columns, in which switching between the output voltages Vx that are provided from the unit pixels 11 of the plurality of columns is performed by switching means, and in which one selected output voltage Vx is supplied to the common column processing circuit 15 or 15A.

APPLICATION EXAMPLE

The above-described CMOS image sensor 10 or 50, in which column-parallel ADCs are mounted, according to the first or second embodiment is suitable for using in an image-pickup apparatus, such as a camcorder, a digital still camera, and a camera module for mobile equipment including a mobile phone and so forth, as an image-pickup device of the image-pickup apparatus.

Herein, an image-pickup apparatus is referred to as a solid-state image-pickup device serving as an image-pickup device; a camera module (for example, which is used in a state in which it is mounted in electronic equipment such as a mobile phone) including an optical system, which gathers image light of an object on an image-pickup surface (a light-receiving surface) of the solid-state image-pickup device, and a signal processing circuit of the solid-state image-pickup device; or a camera system, such as a digital still camera or a camcorder, in which the camera module is mounted.

Figure 10:
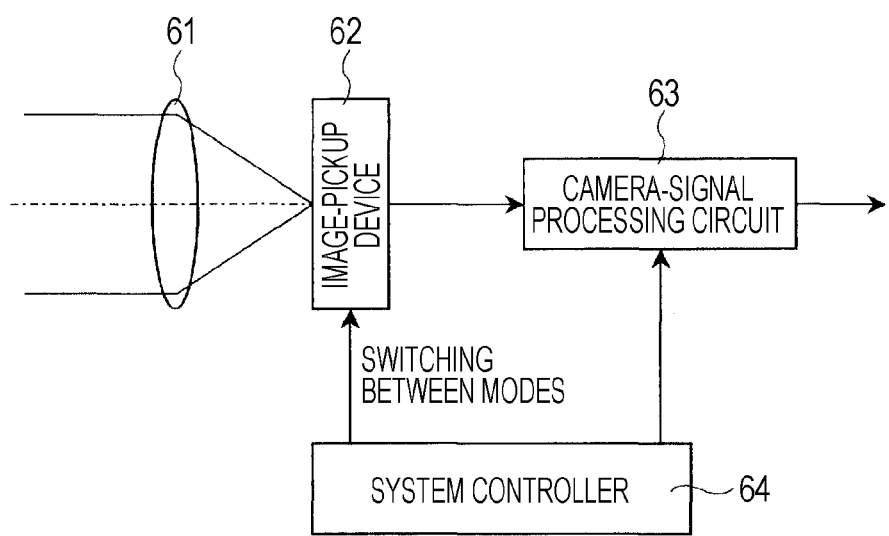
FIG. 10 is a block diagram showing one example of a configuration of an image-pickup apparatus according to the present invention.
Figure 11:
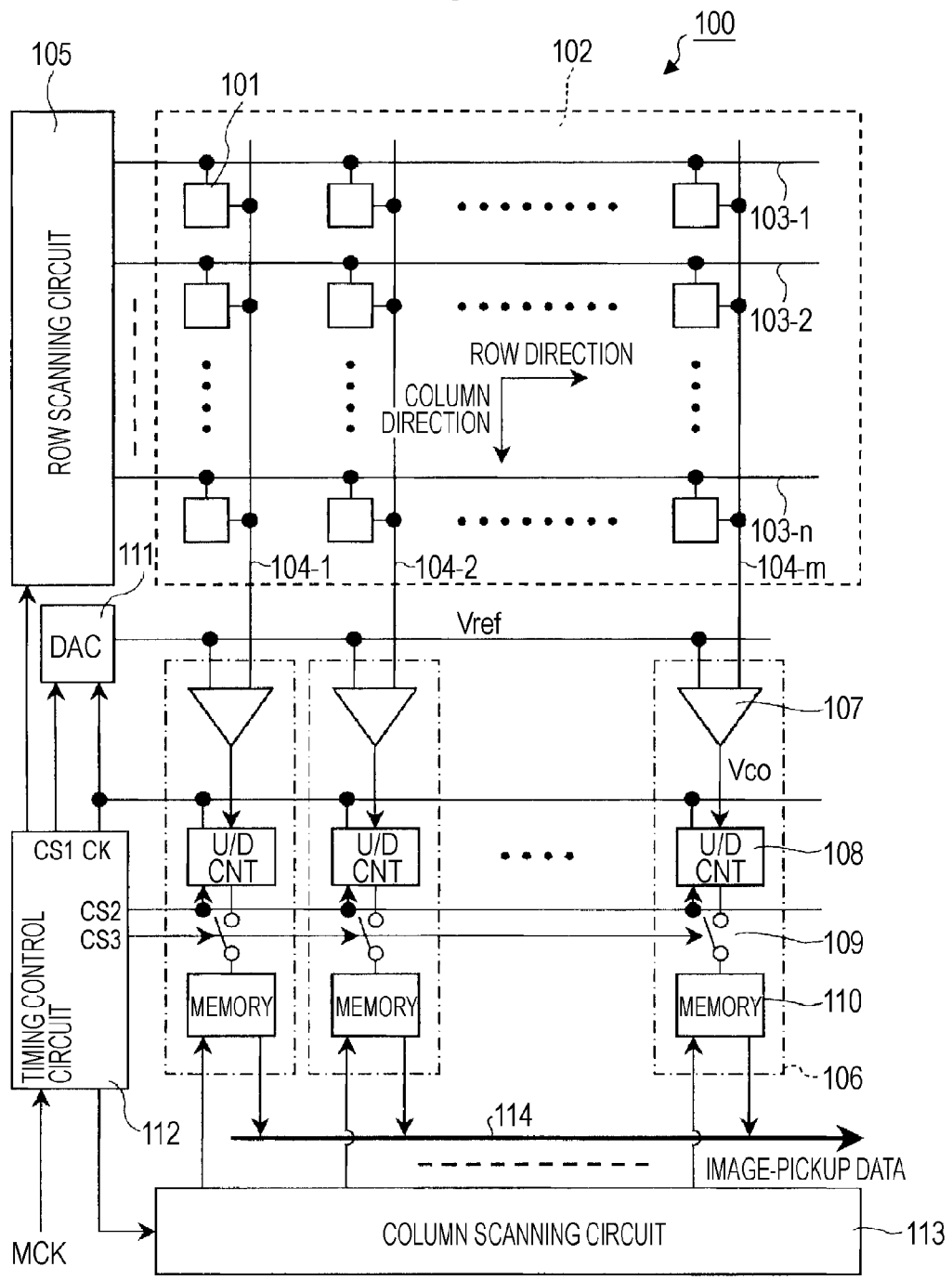
FIG. 11 is a block diagram showing a configuration of a CMOS image sensor, in which column-parallel ADCs are mounted, according to an example of the prior art.
Figure 12:
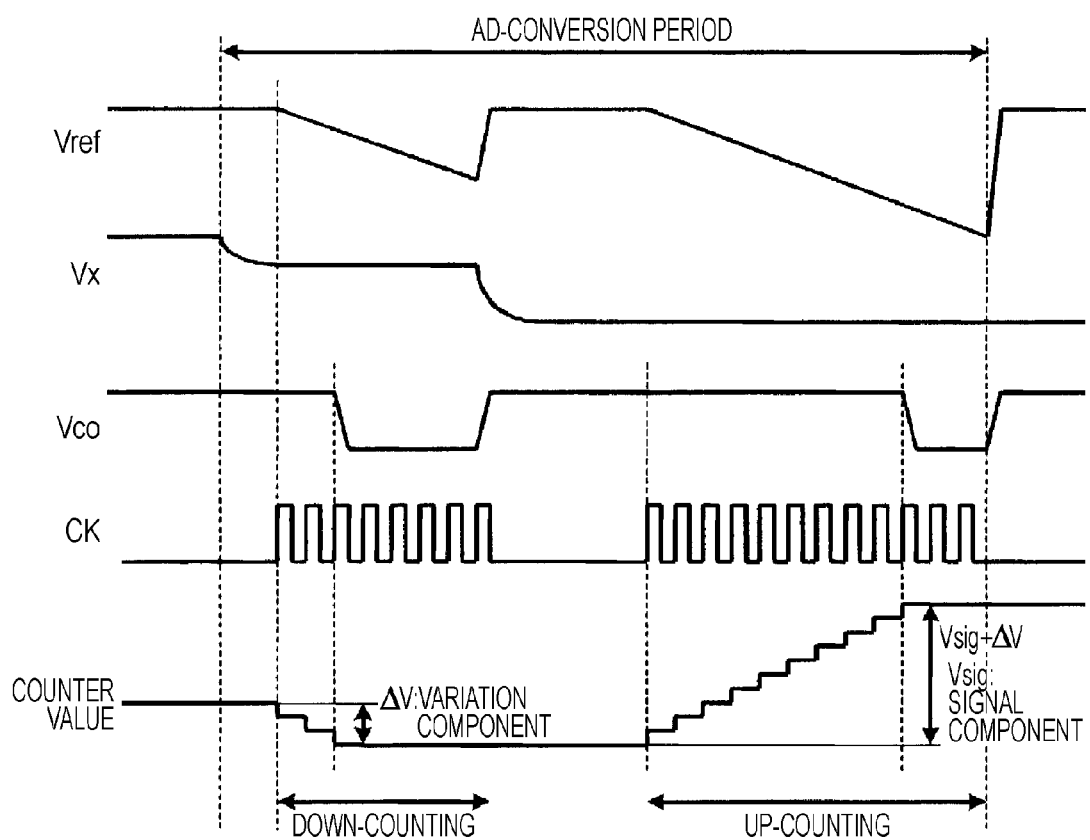
FIG. 12 is a timing chart provided for explaining a circuit operation of the CMOS image sensor according to the example of the prior art.

FIG. 10 is a block diagram showing one example of a configuration of an image-pickup apparatus according to the present invention. As shown in FIG. 10, the image-pickup apparatus according to the present invention is configured using an optical system including a lens 61, an image-pickup device 62, a camera-signal processing circuit 63, a system controller 64, and so forth.

The lens 61 gathers image light from an object on an image-pickup surface of the image-pickup device 62. The image-pickup device 62 outputs an image signal that is obtained by converting the image light, which is gathered on the image-pickup surface by the lens 61, into an electric signal in units of pixels. The CMOS image sensor 10 or 50, in which column-parallel ADCs are mounted, according to the above-described first or second embodiment is used as the image-pickup device 62.

The camera-signal processing circuit 63 performs various type of signal processing on the image signal that is output from the image-pickup device 62. The system controller 64 performs control for the image-pickup device 62 and the camera-signal processing circuit 63. Particularly, if the column-parallel ADCs of the image-pickup device 62 can perform operations of AD conversion corresponding to respective operation modes including a normal frame rate mode using a progressive scanning scheme in which information concerning all pixels is read, and a high-speed frame rate mode in which an exposure time for the pixels is set to be 1/N and the frame rate is increased N times, compared with the case of the normal frame rate mode, the camera-signal processing circuit 63 performs control of switching between the operation modes or the like in accordance with an instruction from the outside.

As described above, the CMOS image sensor 10 or 50, in which column-parallel ADCs are mounted, according to the above-described first or second embodiment is used in an image-pickup apparatus such as a camcorder, a digital still camera, and a camera module for mobile equipment including a mobile phone and so forth, as the image-pickup device 62 of the image-pickup apparatus, whereby high-speed image pickup can be performed because the CMOS image sensor 10 or 50 can perform high-resolution AD conversion at a high speed. Furthermore, because a period of the operation of AD conversion is short, there is an advantage that power consumption of the CMOS image sensor, and further, the entire image-pickup apparatus can be reduced.

What is claimed is:

1. A solid-state image-pickup device comprising:
a pixel-array section in which unit pixels including photoelectric conversion elements are two-dimensionally disposed in a matrix form, and in which each of column signal lines is disposed in a corresponding one of columns for a disposition of the unit pixels in the matrix form;
a row scanning unit configured to selectively control the respective unit pixels of the pixel-array section on a row-by-row basis; and
an analog-to-digital conversion unit configured to convert, to a digital signal, an analog signal that is output from a corresponding one of the unit pixels of a row which is selectively controlled by the row scanning unit via a corresponding one of the column signal lines,
wherein,
the analog-to-digital conversion unit includes (a) a first comparison unit configured to compare the analog signal with any one of a plurality of first reference voltages having slopes with the same gradient, (b) a second comparison unit configured to compare, with the one of the plurality of first reference voltages that is used by the first comparison unit, a second reference voltage having a slope with a gradient that is different from the gradient of the slopes of the first reference voltages, and (c) a counting unit configured to perform a counting operation using a counting amount according to comparison results of the first and second comparison units, and for providing a counter value that is obtained by the counting operation as the digital signal.

2. The solid-state image-pickup device according to claim 1, further including a reference-voltage generating unit configured to generate a plurality of reference voltages having slopes with the same gradient and having different offsets as the plurality of first reference voltages,
wherein,
the analog-to-digital conversion unit includes (a) a reference-voltage selection unit configured to select any one of the plurality of first reference voltages in accordance with a signal level of the analog signal, and for supplying the one of the plurality of first reference voltages to the first comparison unit.

3. The solid-state image-pickup device according to claim 2, wherein the reference-voltage generating unit comprises a first and a second digital-to-analog conversion circuits that generate the plurality of reference voltages.

4. The solid-state image-pickup device according to claim 3, wherein the reference-voltage generating unit is outside of the analog-to-digital conversion unit.

5. The solid-state image-pickup device according to claim 3, wherein the first digital-to-analog conversion circuit generates the plurality of first reference voltages and the plurality of reference voltages having slopes with the same gradient and having different offsets, and the second digital-to-analog conversion circuit generates the second reference voltage.

6. The solid-state image-pickup device according to claim 3, wherein the first and the second digital-to-analog conversion circuits generate the plurality of first reference voltages and the second reference voltage on the basis of a clock in a timing control circuit.

7. The solid-state image-pickup device according to claim 6, wherein the first digital-to-analog conversion circuits generates the plurality of reference voltages having slopes with the same gradient and having different offsets on the basis of the clock in the timing control circuit.

8. The solid-state image-pickup device according to claim 6, wherein the analog-to-digital conversion unit is configured to use the plurality of reference voltages having slopes with the same gradient and having different offsets in the comparison when an amount of incident light to the unit pixels is larger than a light threshold and an amplitude of the digital signal is larger than an amplitude threshold.

9. The solid-state image-pickup device according to claim 2, wherein the plurality of reference voltages having slopes with the same gradient and having different offsets is a specific number of reference voltages, and the specific number is determined based on an amplitude of the digital signal.

10. The solid-state image-pickup device according to claim 2, wherein an offset for the plurality of reference voltages having slopes with the same gradient and having different offsets is added in the analog-to-digital conversion unit.

11. The solid-state image-pickup device according to claim 1, further including a reference-voltage generating unit configured to generate a single reference voltage having a slope,
wherein,
the analog-to-digital conversion unit includes (a) an offset generating unit configured to provide an offset for the single reference voltage in accordance with a signal level of the analog signal so that the voltage is shifted, and to supply the single reference voltage as any one of the plurality of first reference voltages to the first comparison unit.

12. The solid-state image-pickup device according to claim 1, wherein a polarity of the gradient of the slopes of the first reference voltages and a polarity of the gradient of the slope of the second reference voltage are different from each other.

13. The solid-state image-pickup device according to claim 1, wherein the counting amount of the counting unit is switched in accordance with the gradients of the slopes of the first and second reference voltages.

14. The solid-state image-pickup device according to claim 1, wherein the counting amount of the counting unit is switched in accordance with logic states of the comparison results of the first and second comparison units.

15. The solid-state image-pickup device according to claim 1, wherein a first digital-to-analog conversion circuit generates the plurality of first reference voltages and a second digital-to-analog conversion circuit generates the second reference voltage.

16. A method for driving a solid-state image-pickup device including (a) a pixel-array section in which unit pixels including photoelectric conversion elements are two-dimensionally disposed in a matrix form, and in which each of column signal lines is disposed in a corresponding one of columns for a disposition of the unit pixels in the matrix form, and (b) a row scanning unit configured to selectively control the respective unit pixels of the pixel-array section on a row-by-row basis, the method comprising:
a first comparison step of comparing, with any one of a plurality of first reference voltages having slopes with the same gradient, an analog signal that is output from a corresponding one of the unit pixels of a row which is selectively controlled by the row scanning unit via a corresponding one of the column signal lines;
a second comparison step of comparing, with the one of the plurality of first reference voltages that is used in the first comparison step, a second reference voltage having a slope with a gradient that is different from the gradient of the slopes of the first reference voltages; and a counting step of performing a counting operation using a counting amount according to comparison results in the first and second comparison steps, and of providing a counter value that is obtained by the counting operation as a digital signal.

17. An image-pickup apparatus comprising:
(A) a solid-state image-pickup device including (1) a pixel-array section in which unit pixels including photoelectric conversion elements are two-dimensionally disposed in a matrix form, and in which each of column signal lines is disposed in a corresponding one of columns for a disposition of the unit pixels in the matrix form, (2) a row scanning unit configured to selectively control the respective unit pixels of the pixel-array section on a row-by-row basis, and (3) an analog-to-digital conversion unit configured to convert, to a digital signal, an analog signal that is output from a corresponding one of the unit pixels of a row which is selectively controlled by the row scanning unit via a corresponding one of the column signal lines; and (B) an optical system that leads light from an object onto an image-pickup surface of the solid-state image-pickup device, wherein,
the analog-to-digital conversion unit includes (a) a first comparison unit configured to compare the analog signal with any one of a plurality of first reference voltages having slopes with the same gradient, (b) a second comparison unit configured to compare, with the one of the plurality of first reference voltages that is used by the first comparison unit, a second reference voltage having a slope with a gradient that is different from the gradient of the slopes of the first reference voltages, and (c) a counting unit configured to perform a counting operation using a counting amount according to comparison results of the first and second comparison units, and for providing a counter value that is obtained by the counting operation as the digital signal.

* * * * *